US006703652B2

(12) United States Patent
Van Brocklin et al.

(10) Patent No.: US 6,703,652 B2
(45) Date of Patent: Mar. 9, 2004

(54) MEMORY STRUCTURE AND METHOD MAKING

(75) Inventors: Andrew L Van Brocklin, Corvallis, OR (US); Peter Fricke, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 50 days.

(21) Appl. No.: 10/051,677

(22) Filed: Jan. 16, 2002

(65) Prior Publication Data

US 2003/0132458 A1 Jul. 17, 2003

(51) Int. Cl.[7] ............................................. H01L 27/115
(52) U.S. Cl. ..................................... 257/209; 365/225.7
(58) Field of Search .......................... 257/50, 209, 278, 257/529, 530; 438/131, 132, 467, 600; 365/96, 100, 225.7

(56) References Cited

U.S. PATENT DOCUMENTS

| | | | | |
|---|---|---|---|---|
| 5,625,220 A | | 4/1997 | Liu et al. ..................... 257/530 |
| 5,714,416 A | * | 2/1998 | Eichman et al. ............ 438/600 |
| 5,726,484 A | * | 3/1998 | Hart et al. ................... 257/530 |
| 5,835,396 A | | 11/1998 | Zhang .......................... 365/52 |
| 5,926,415 A | | 7/1999 | Shin ...................... 365/185.17 |
| 6,002,607 A | | 12/1999 | Dvir ........................... 365/103 |
| 6,034,882 A | | 3/2000 | Johnson et al. ............. 365/103 |
| 6,185,121 B1 | | 2/2001 | O'Neill ....................... 365/94 |
| 6,185,122 B1 | | 2/2001 | Johnson et al. ............. 365/103 |
| 6,515,888 B2 | * | 2/2003 | Johnson et al. ............. 365/130 |
| 2003/0062590 A1 | * | 4/2003 | Anthony ..................... 257/529 |
| 2003/0081445 A1 | * | 5/2003 | Van Brocklin et al. ..... 365/100 |

* cited by examiner

Primary Examiner—Erik J. Kielin
Assistant Examiner—Jennifer M Dolan

(57) ABSTRACT

A memory structure has a plurality of row conductors intersecting a plurality of column conductors at a plurality of intersections. Each intersection includes an electrically linear resistive element in series with a voltage breakdown element.

30 Claims, 6 Drawing Sheets

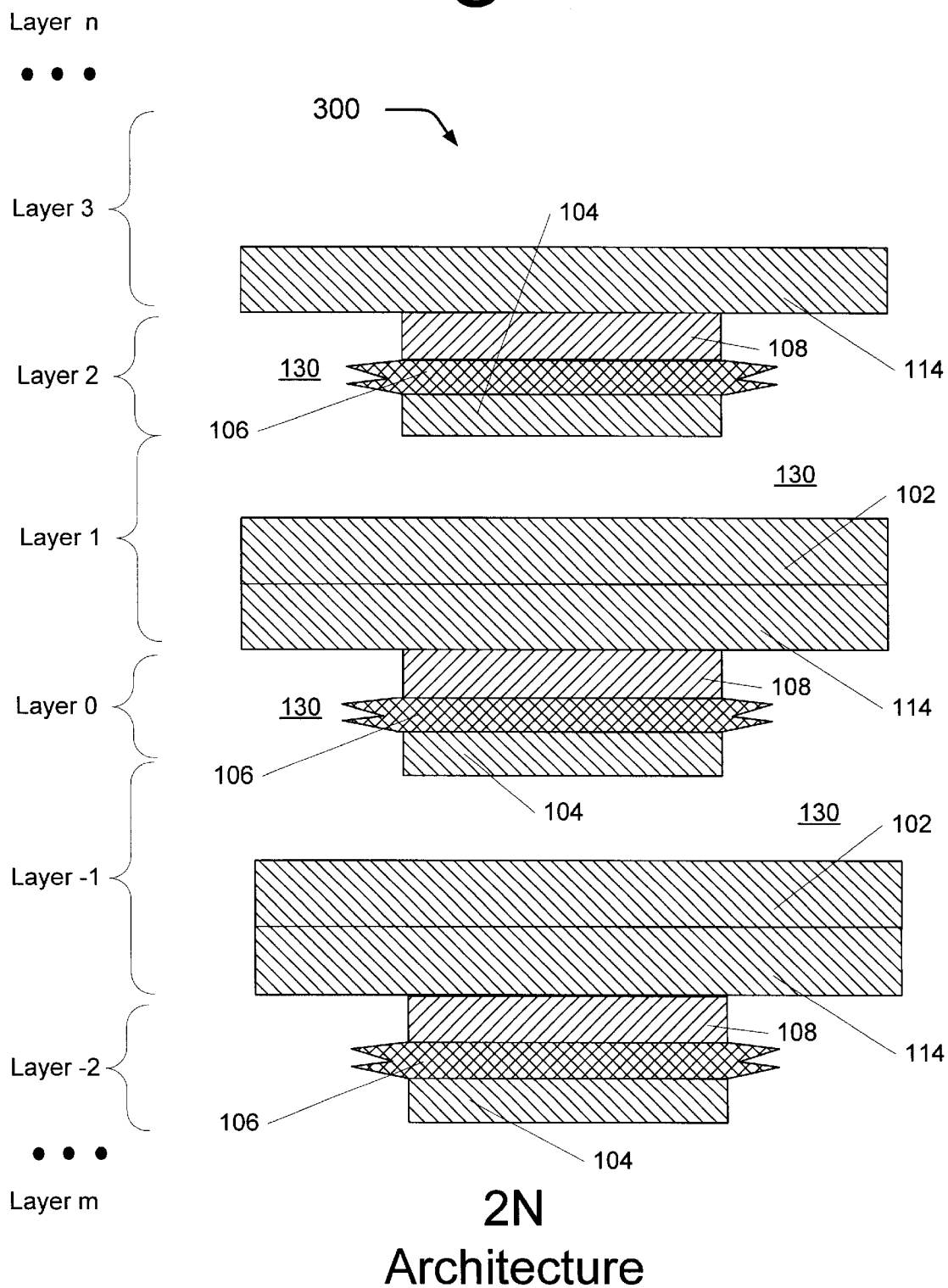

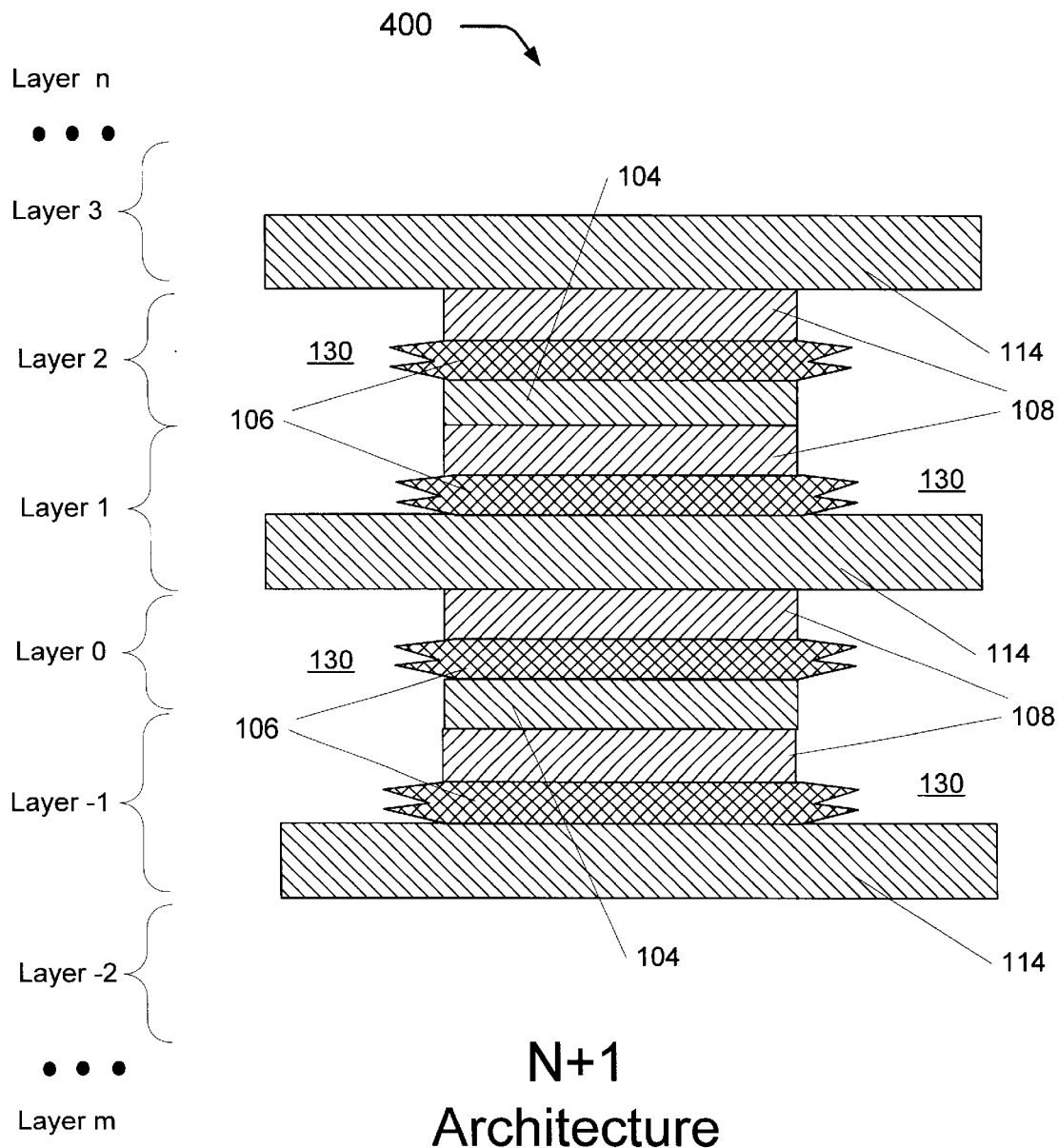

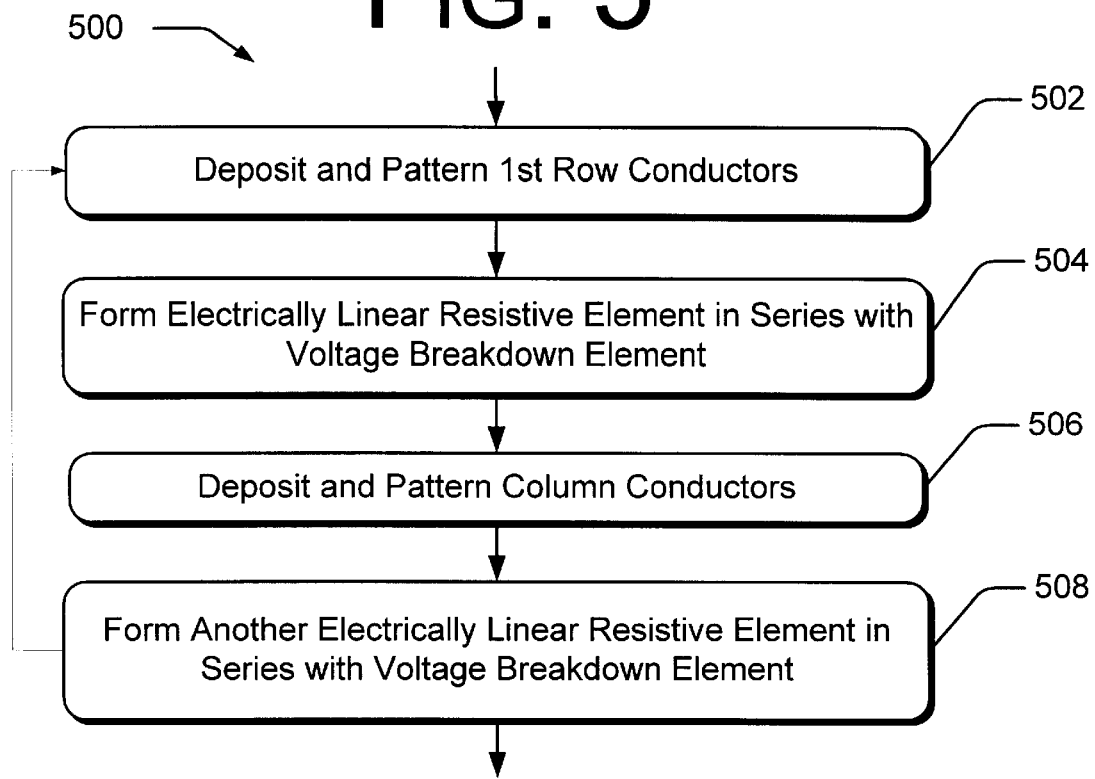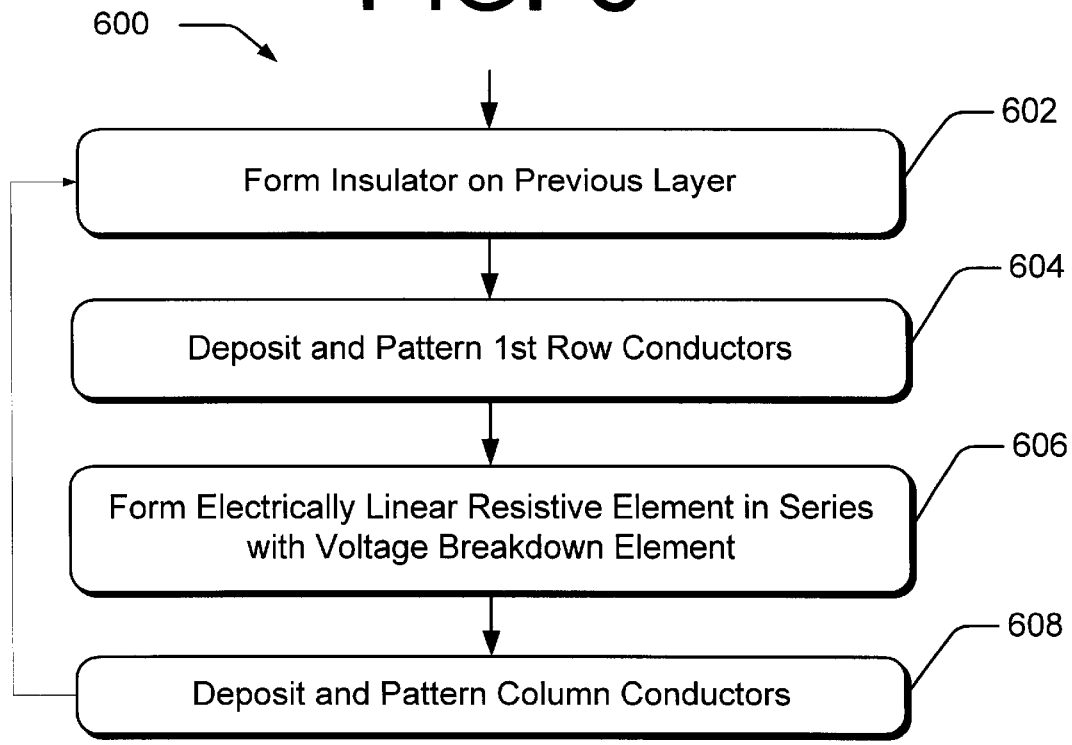

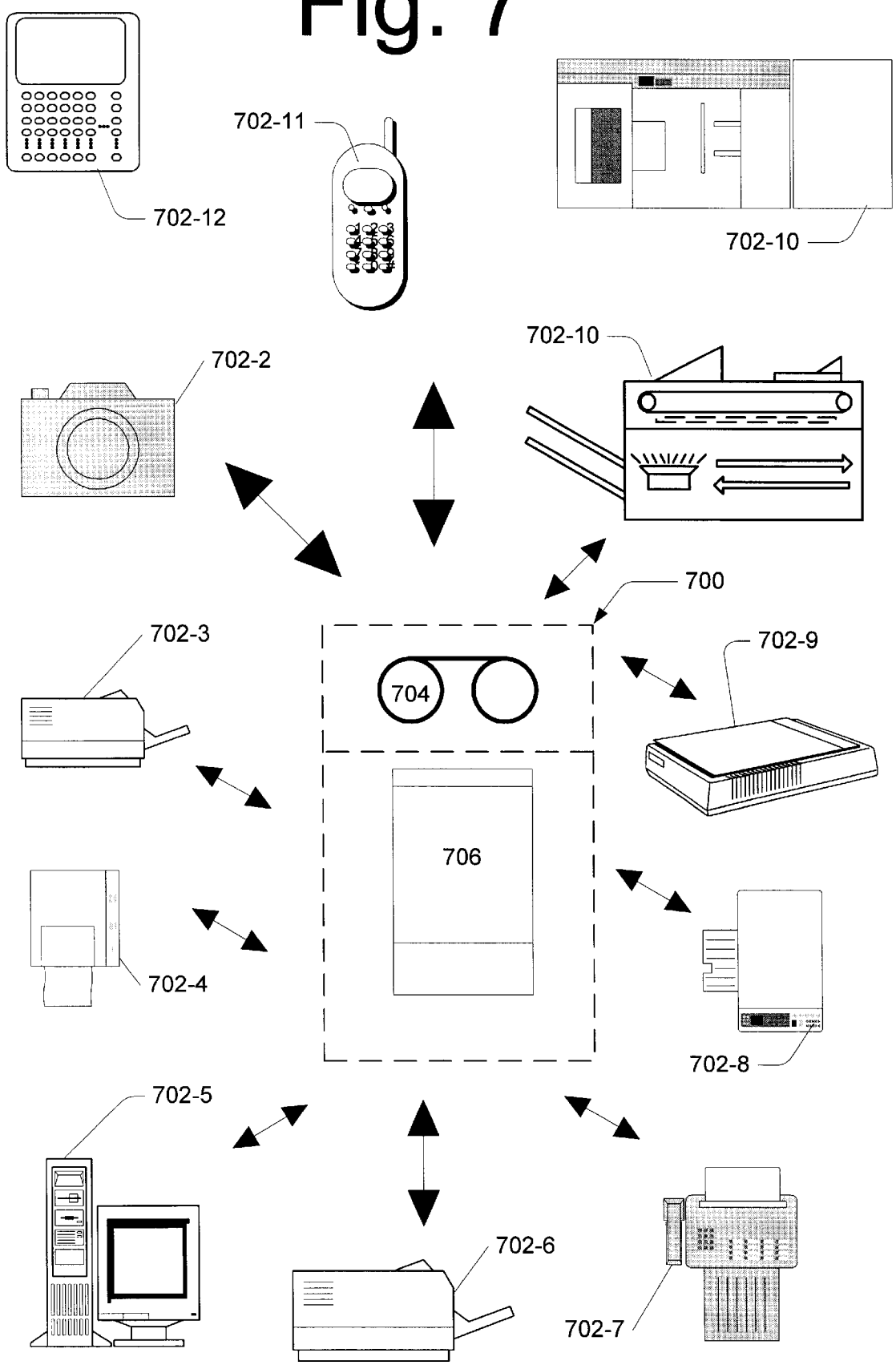

MEMORY STRUCTURE AND METHOD MAKING

FIELD OF THE INVENTION

The present invention relates to memory, and is more particularly related to a memory structure and method of making.

BACKGROUND OF THE INVENTION

Memory structures can have multiple layers and can require a transistor to decode the memory. The fabrication of memory structures of this type can require a significant number of processing steps for each layer of memory. Short processing time in the clean room environment is desirable because operation and maintenance of the clean room environment for memory cell fabrication using semiconductor technology processes is time consuming and expensive. Fewer process steps in memory structure fabrication are desirable because each fabrication process step is both an expense and an opportunity to reduce yield. As such, it would be an advance in the art to reduce the time and processing required to fabricate memory structures.

Layered memory structures can be fabricated on a semiconductor wafer that can be diced into a plurality of semiconductor chips. In large scale integration, a goal is to maximize the number of devices on a semiconductor chip. When a memory structure requires a transistor for decoding, the goal of large-scale integration in mitigated by the requirement for the space that is taken up by the decoding transistor. As such, it would be an advance in the art to fabricate memory structures without decoding transistors.

SUMMARY OF THE INVENTION

In one embodiment, a memory structure has a plurality of row conductors intersecting a plurality of column conductors at a plurality of intersections. Each intersection includes an electrically linear resistive element in series with a voltage breakdown element.

These and other features of the present invention will become more fully apparent from the following description and appended claims, or may be learned by the practice of the invention as set forth hereinafter.

DESCRIPTION OF THE DRAWINGS

To further clarify the above and other advantages and features of the present invention, a more particular description of the invention will be rendered by reference to specific embodiments thereof which are illustrated in the appended drawings. The same numbers are used throughout the drawings to reference like features and components. It is appreciated that these drawings depict only typical embodiments of the invention and are therefore not to be considered limiting of its scope. The invention will be described and explained with additional specificity and detail through the use of the accompanying drawings in which:

FIG. 3 is a cross-sectional view of a memory structure having a 2N architecture in accordance with yet another embodiment of the invention.

FIG. 4 is a cross-sectional view of a memory structure having an N+1 architecture in accordance with still another embodiment of the invention.

FIG. 5 is a flowchart depicting a method of making a memory structure having an N+1 architecture in accordance with an embodiment of the invention.

FIG. 6 is a flowchart depicting a method of making a memory structure having a 2N architecture in accordance with yet another embodiment of the invention.

FIG. 7 is block diagram, according to an embodiment of the present invention, depicting a computing environment for a memory structure.

DETAILED DESCRIPTION

Figure 1A:
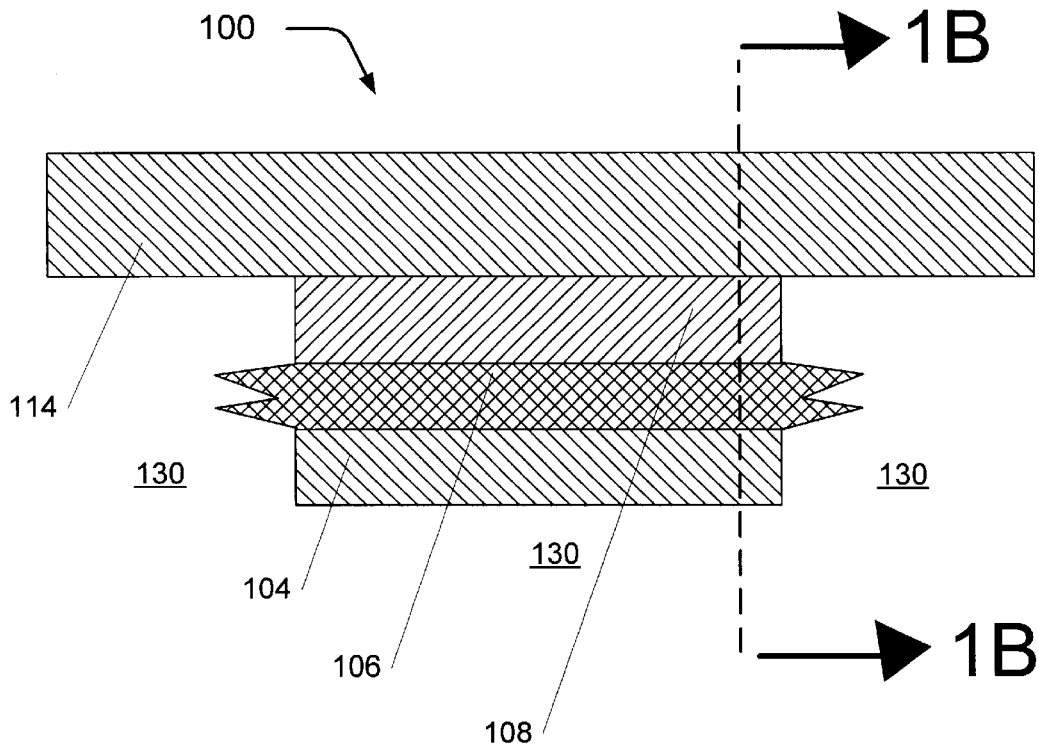
FIG. 1A is a cross-sectional view of an implementation of the disclosed invention in which a memory structure is fabricated using integrated circuit wafer fabrication materials and processes.
Figure 1B:
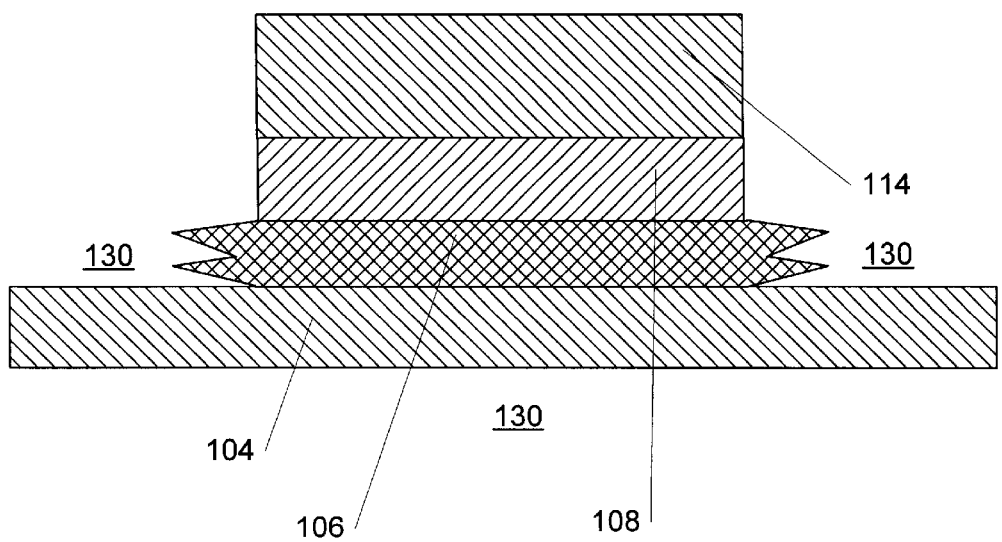
FIG. 1B is a cross-sectional view of the structure seen in FIG. 1A taken along the 1B—1B section line.

FIGS. 1A–1B depicts, in cross section, a memory structure 100. The memory structure 100 has a row conductor 114. Row conductor 114 is orthogonal to a column conductor 104. In between row conductor 114 and column conductor 104 is an electrically linear resistive element 108 and a voltage breakdown element 106 which can be either patterned or unpatterned. The electrically linear resistive element 108 is in series with the voltage breakdown element 106. An interlayer dielectric (ILD) 130 is represented in FIGS. 1A–1B is being at the periphery of each layer 104, 106, 108, and 1114. The voltage breakdown element 106 will preferably be an antifuse. The antifuse will preferably include a dielectric having a thickness not greater than about 200 Angstroms. Most preferably, the dielectric will have a thickness in a range from about 10 Angstroms to about 20 Angstroms.

The electrically linear resistive element 108, in one embodiment of the invention, can be a resistor that, for linear changes in voltage, will have a linear change in current. In yet another embodiment of the invention, the electrically linear resistive element can be composed of various materials, including intrinsic silicon and a refractory metal silicide nitride such as tungsten silicide nitride. In a still further embodiment of the invention, the electrically linear resistive element can be a material that is capable of temporarily changing its resistance characteristic. An example of such a material is lightly doped microcrystalline to amorphous silicon or (a-Si). When so used, lightly doped a-Si can reversibly enhance its current flow by lowering its resistance. As such, the a-Si functions as a sort of amorphous switch. The function is accomplished in that the lightly doped a-Si temporarily enhances the number of carriers in the a-Si, thus lowering the resistance heavily so that there is very low resistance path. In application of this function in a memory device, all memory cells (e.g. all the resistive areas) in a row conductor will be turned on when the row conductor is energized because all resistive areas will realize a relatively low resistance. Conversely, the memory cells that are not selected by being energized will maintain a high resistance.

By providing a memory cell having a resistive material with an electrical characteristic that produces linear current changes for linear voltage changes, a memory device made of these memory cells will have a high resistance at a low voltage bias. This in turn minimizes the sneak current path on memory cells that are not to be accessed. Thus, the resulting signal from each memory cell will be larger and the memory device will be faster. As such, the memory device can be built with a larger number of memory cells because the maximum number of memory cells that can be in the memory device is a function of the sneak current path. As the sneak current magnitude is reduced, the number of memory cells that can be in a memory device increases. Sensing circuits for resistive memory arrays have also advanced in the state of the art to support even larger arrays in conjunction with minimizing the sneak current component. Accordingly, larger scale integration using smaller memory cells with resistive control elements in the memory device can be achieved. The memory device can be fabricated, as described below, by processes that cost less than conventional processes.

The voltage breakdown element 106 is preferably composed of an electrically insulative material that includes but is not limited to oxide-nitride-oxide (ONO), tantalum pentoxide ($Ta_2O_5$), plasma enhanced silicon nitride ($P-SiN_x$), titanium oxide, germanium oxide, any chemical vapor deposited (CVD) dielectric including a deposited oxide, a grown oxide, and/or like dielectric materials. The ILD 130 is preferably composed of an electrically insulative material that includes but is not limited to a wet or dry silicon dioxide ($SiO_2$), a nitride material including silicon nitride, tetraethylorthosilicate ($SiOC_2H_5)_4$) (TEOS) based oxides, borophosphosilicate glass (BPSG), phosphosilicate glass (PSG), borosilicate glass (BSG), polyamide film, oxynitride, a spin on glass (SOG), any chemical vapor deposited (CVD) dielectric including a deposited oxide, a grown oxide, and/or like dielectric materials. When composed of TEOS based oxides, ILD 130 can be formed by a deposition resulting from the decomposition of a TEOS gas in a reactor.

Figure 2A:
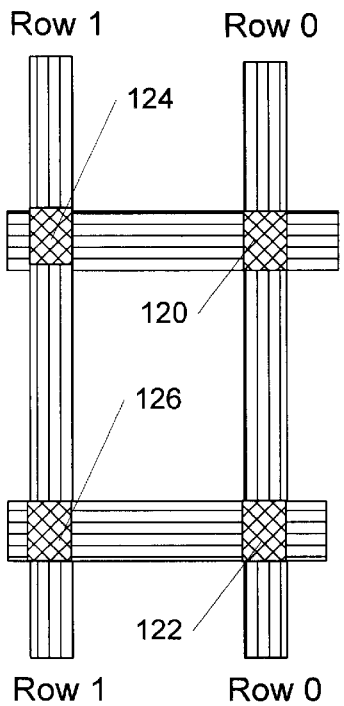
FIG. 2A is a two dimensional representative view of a memory structure in accordance with one embodiment of the invention, and shows four (4) intersections between two row conductors and two column conductors.
Figure 2B:
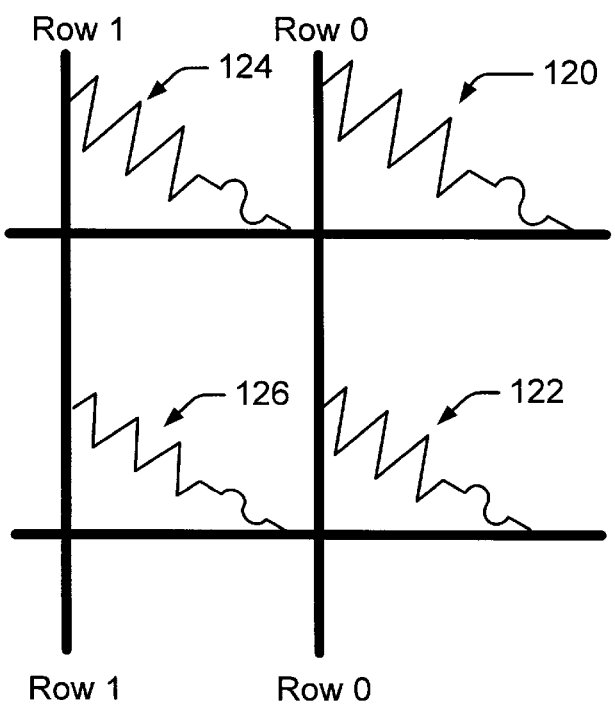
FIG. 2B is a schematic representation of the two dimensional representative view seen in FIG. 2A.

Row 0 and Row 1 make a total of four (4) intersections with Column 0 and Column 1 in the cross point array seen in FIG. 2a. FIG. 2b is an electrical schematic representation of FIG. 2a. Each intersection between a row and a column in FIG. 2a is intended to be an electrically linear resistive element in series with a voltage breakdown element as seen in FIG. 2b. Examples of the types of electrically linear resistive element in series with a voltage breakdown element are given above with respect to FIGS. 1A–1B. Row 0 intersects with Column 0 and Column 1, respectively, at intersections 120 and 122. Row 1 intersects with Column 0 and Column 1, respectively, at intersections 124 and 126. In operation, to read the memory element 120 in FIG. 2b at the intersection of Row 0 and Column 0, a voltage Vr is driven on Row 0. Row 1 is held at Vrs. Column 0 is connected to a low impedance input current mirror or transductance amplifier. The current output from Column 0 is the signal to be measured. A reference structure (not shown) can be used to provide a decision value to compare the current from Column 0 to the reference current. A logic 1 can be described as a column 0 current that is greater than the reference current and a logic 0 can be described as a Column 0 current less than the reference current.

Figure 2C:
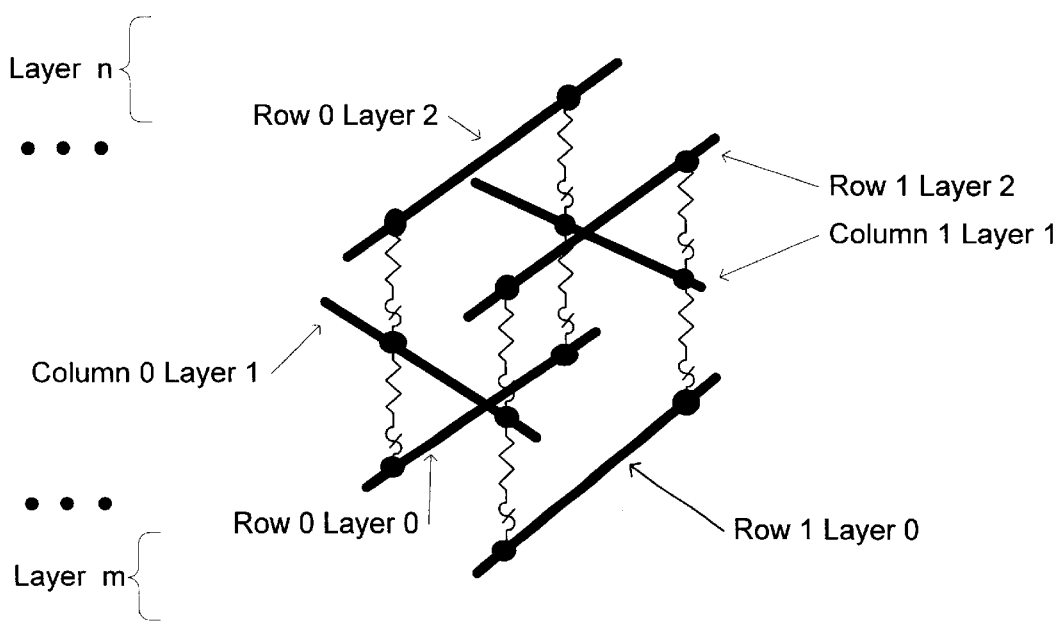
FIG. 2C is a three dimensional representative view of a memory structure in accordance with another embodiment of the invention, where the depicted N+1 architecture features two memory cell layers and three conductor layers.

FIG. 2c shows an embodiment of the invention featuring layered memory structures, including Layers m through n in an N+1 architecture. Two memory cell layers and three conductor layers are seen in FIG. 2c. Various connections between adjacent layers are seen in the memory structure of FIG. 2c. Each connection between adjacent layers is represented in FIG. 2c as being an electrically linear resistive element in series with a voltage breakdown element. Row 0, layer 0 and Row 1, layer 2 have Column 0, layer 1 there between. Memory layers in FIG. 2c extend from Layer m to Layer n. Examples of both the electrically linear resistive element and the voltage breakdown element depicted in FIGS. 2a, 2b, and 2c are given above with respect to FIGS. 1A–1B.

A memory structure 300 is seen in cross section in FIG. 3. Memory structure 300 has a 2N architecture. In between adjacent row conductors 114 are a plurality of structures. The plurality of structures includes electrical insulator 102, a column conductor 104, first voltage breakdown element 106, and first electrically linear resistive element 108. Memory layers seen in memory structure 300 include Layers m through n. ILD 130 is represented in FIG. 3 as being situated at the periphery and between the depicted Layers m through n. Each voltage breakdown element 106 is sandwiched between column conductor 104 and electrically linear resistive element 108. Examples of both the electrically linear resistive element 108 and the voltage breakdown element 106 depicted in FIG. 3 are given above with respect to FIGS. 1A–1B.

A memory structure 400 is seen in cross section in FIG. 4. Memory structure 400 has an N+1 architecture. In between adjacent row conductors 114 are a plurality of structures. The plurality of structures includes first and second voltage breakdown elements 106, first and second electrically linear resistive elements 108, and a column conductor 104. Memory layers seen in memory structure 400 include Layers m through n. ILD 130 is represented in FIG. 4 as being situated between adjacent row conductors 114. Each column conductor 104 is sandwiched between a pair of intersections to an adjacent row conductor 114, where each of the intersections is an electrically linear resistive element in series with a voltage breakdown element. Examples of both the electrically linear resistive element and the voltage breakdown element depicted in FIG. 4 are given above with respect to FIGS. 1A–1B.

A process 500 for forming embodiments of a memory structure is represented in FIG. 5. Process 500 accomplishes an N+1 architecture and the formation of a plurality of row conductors so as to intersect with a plurality of column conductors at a plurality of intersections. Each of the intersections that are formed in process 500 includes an electrically linear resistive element in series with a voltage breakdown element.

At step 502, a first layer of row material is deposited and patterned to form a first plurality of row conductors, an example of which is seen in FIGS. 1A–1B and 4 as row conductors 114. At step 504, a voltage breakdown material and an electrically linear resistive material are formed to be electrically connected in series. Examples of the series connects are seen in FIGS. 1A, 1B, 2a–2c, and 4. At step 506, a first layer of column material is deposited and patterned to form the plurality of column conductors, an example of which is seen in FIGS. 1A–1B and 4 as column conductors 104. At step 508, another series connection is made with a voltage breakdown material and an electrically linear resistive material, examples which are seen in FIGS. 1A, 1B, 2a–2c, and 4. The foregoing steps can be repeated, where process 500 returns to perform step 502 after performing step 508. The repetition of steps accomplishes the construction of a three dimensional series of vertical stacked memory layers one over another, such as Layers m through n seen in FIG. 4.

A process 600 for forming embodiments of a memory structure is represented in FIG. 6. Process 600 accomplishes a 2N architecture and the formation of a plurality of row conductors so as to intersect with a plurality of column conductors at a plurality of intersections. Each of the intersections that are formed in process 600 includes an electrically linear resistive element in series with a voltage breakdown element.

At step 602, an insulator is formed on a previously formed memory layer. The previously formed memory layer could be any of Layers m through n seen in FIG. 3. At step 604, a first layer of row material is deposited and patterned to form a first plurality of row conductors, an example of which is seen in FIGS. 1A–1B and 3 as row conductors 114. At step 606, a voltage breakdown material and an electrically linear resistive material are formed to be electrically connected in series. Examples of the series connects are seen in FIGS. 1A–1B, 2a–2c, and 3. At step 608, a first layer of column material is deposited and patterned to form the plurality of column conductors, an example of which is seen in FIGS. 1A–1B and 3 as column conductors 104. The foregoing steps can be repeated, where process 600 returns to perform step 602 after performing step 608. The repetition of steps accomplishes the construction of a three dimensional series of vertical stacked memory layers one over another, such as Layers m through n seen in FIG. 3.

As a cost savings measure, the method of making the memory structure according to the invention can avoid the patterning of various materials. The material used for the optional electrical insulator and the voltage breakdown element can be deposited and left unpatterned in the memory structure. This is preferably useful with a tunnel junction voltage breakdown element since sheet resistance will be exponentially high between conductors. In another embodiment of the invention, an interlayer dielectric situated between adjacent row conductors can be integral the optional electrical insulator.

As discussed above, the voltage breakdown element can be an antifuse. The antifuse will preferably include a material which initially has a high resistance but which can be converted into a low resistance material by the application of a programming voltage. The programming voltage is in excess of a breakdown voltage of the high resistance material. The high resistance material is an electrically insulating antifuse layer which is sandwiched between a pair of electrically conductive layers. Each electrically conductive layer in the pair is generally considered an antifuse electrode of the antifuse structure. The high resistance material, also called an antifuse material or an antifuse layer, is non-conductive when manufactured but is caused to become permanently conductive by application of the programming voltage across the pair of electrically conductive layers.

When a programming current is applied through the antifuse layer across the pair of electrically conductive layers, an electrically conductive filament forms in the antifuse layer. The newly formed electrically conductive filament in the antifuse layer, which can be as narrow as several atoms in width, is effective as an electrical short of the two electrically conductive layers, thus programming the antifuse structure. Those antifuse structures that remain unprogrammed have no electrically conductive filament connecting their respective pair of electrically conductive layers.

It is contemplated that embodiments of the memory structure of the invention can be fabricated by integrated circuit (IC) technology. This fabrication can be directed to certain classes of IC chips such as field programmable gate arrays (FPGAs), programmable read-only memories (PROMs) and the like. FPGAs typically include a large number of logic elements, such as AND gates and OR gates, which can be selectively coupled to perform user designed functions. Programming a FPGA is generally accomplished by applying a programming voltage to selected antifuse structures thereby converting them into conductive interconnections.

Each row conductor 114 can be a word line for the memory structure and will preferably have a thickness in a range from about 200 Angstroms to about 18000 Angstroms, and most preferably about 3600 Angstroms. The composition of the electrically conductive material of row conductor 114 can be a metal such as aluminum, copper, or an aluminum-copper alloy, and can also be composed of a silicide, an amorphous silicon, or microcrystalline silicon.

Voltage breakdown element 106 can be formed by a deposition, will preferably have a thickness in a range from about 6 Angstroms to about 30 Angstroms and be composed of a high resistance material that can be converted into a low resistance material by the application of a programming voltage that induces a state change in voltage breakdown element 106.

The composition of voltage breakdown element 106 can be a deposited oxide or a material that is oxidized in an oxidation process after it is deposited over underlying row conductors 114. By way of example, voltage breakdown element 106 can be formed as two layers, one of which is a resistive layer and other of which is a diffusion layer. The resistive layer can be a tunnel junction layer, an electrical insulation layer, or a high resistance layer. The tunnel junction will preferably be constructed of an electrical insulator between two electrodes. The electrical characteristics that are experienced by a tunnel junction are that, for linear increases in voltage, electrical characteristics of the tunnel junction will exhibit an exponential increase in current. The diffusion layer is a conductor layer comprising a material that will easily diffuse through the voltage breakdown element 106 when a programming voltage and current are applied so as to form a high resistance material. The high resistance material becomes a tunnel junction layer that serves as the antifuse material in the antifuse structure. When the antifuse material is to be formed from a deposited aluminum, voltage breakdown element 106 will be formed by a blanket oxidation of the deposited aluminum to form alumina (e.g. $Al_2O_3$). Voltage breakdown element 106 will preferably be deposited in a thickness in a range from about 6 Angstroms to about 30 Angstroms, and most preferably about 15 Angstroms.

FIGS. 1A–1B, 3, and 4 show various memory structures that result from a patterning process that defines a plurality of vertical stacks. The patterning process can be performed by photolithographic and etch processing. Each vertical stack can be formed by several depositions of respective materials of the vertical stacks, followed by an anisotropic etch process of one or more etch recipes so as to form the depicted vertical stacks. Those of skill in the relevant semiconductor fabrication arts, by using the present disclosure as a guide, will recognize other processes and materials which could be used to fabricate the depicted and functionally equivalent structures.

A column conductor 104 can be composed of an electrically conductive material that can be the same as the material of which a row conductor 114 is composed. A column conductor 104 can be formed by using two different materials, such as a refractory metal such as tungsten or an alloy thereof, followed by an overlying column metal such as aluminum. Alternatively, a column conductor 104 can be formed by blanket depositing a single electrically conductive material and then patterning the same to form individual column conductors 104. Each column conductor 104 can serve as a bit line for a memory structure.

FIG. 7 shows a memory structure 700, according to an embodiment of the present invention, that can be used in an apparatus 702-$i$ that makes use of digital memory such as memory structure 700. Apparatus 702-$i$ includes, by way of example and not by way of limitation, a digital camera 702-2, a computing device 702-5 such as a desk top personal computer, various multifunction peripherals (MFPs) 702-3, 702-4, 702-6, and 702-8, a cellular telephone 702-11, and a personal digital assistant 702-12. FIG. 7 also depicts a facsimile machine 702-7, a desk top scanner 702-9, and a high volume copier 702-10 that includes the capabilities of printing on substrates of varied composition, binding, collating, folding, stacking, stapling, stitching, edge-trimming, and paginating. The various electronic apparatus in FIG. 7 are intended to represent other such apparatus including music playing devices such as advanced streaming format players (e.g. MP3 players, Microsoft® Windows Media™ Audio players, etc.), video playing devices, and any portable or fixed electronic apparatus that can utilize memory structure 700 for permanent or removable memory media.

Memory structure 700 can be a memory storage device or a memory apparatus that includes a plurality of memory elements on a substrate. Each memory element includes a plurality of row conductors intersecting with a plurality of column conductors at a plurality of intersections. Each intersection includes an electrically linear resistive element in series with a voltage breakdown element.

Memory structure 700 can be a digital film 704 for use in digital camera 702-2 or a memory card 706 for use in any apparatus 702-$i$. Memory structure 700 can be formed so as to be a write once, read many (WORM) memory device. A WORM memory device will accept data to be stored or written only once. After the sole data storage or writing operation, the data can then be read any number of times. The data is written once by use of expendable antifuses in the WORM device that can only be used once. Alternatively, memory structure 700 can be formed so as to be a one time programmable memory device, such as can be used to store data and or code in any electronic apparatus 702-$i$.

Embodiments of the three dimensional memory structure of the invention will preferably be fabricated upon a substrate such as a semiconductor substrate, such as a silicon wafer. The term "semiconductor substrate" includes semiconductive material. The term is not limited to bulk semiconductive material, such as a silicon wafer, either alone or in assemblies comprising other materials thereon, and semiconductive material layers, either alone or in assemblies comprising other materials. The term "substrate" refers to any supporting structure including but not limited to the semiconductor substrates described above. A substrate may be made of silicon, glass, gallium arsenide, silicon on sapphire (SOS), epitaxial formations, germanium, germanium silicon, diamond, silicon on insulator (SOI) material, selective implantation of oxygen (SIMOX) substrates, and/or like substrate materials. Preferably, the substrate is made of silicon, which is typically single crystalline.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A memory structure comprising a plurality of row conductors intersecting a plurality of column conductors at a plurality of intersections, each said intersection including an electrically linear resistive element in series with a voltage breakdown element, wherein the voltage breakdown element includes an unpatterned antifuse.

2. The memory structure as defined in claim 1, wherein the electrically linear resistive element is selected from the group consisting of intrinsic silicon, lightly doped microcrystalline silicon, lightly doped amorphous silicon, refractory metal silicide nitride, and tungsten silicide nitride.

3. The memory structure as defined in claim 1, wherein the electrically linear resistive element has an electrical characteristic that, for linear changes in voltage, has a linear change in current.

4. The memory structure as defined in claim 1, wherein the plurality of rows and the plurality of column form a memory device selected from the group consisting of a write-once-read-many (WORM) memory device and a one time programmable memory device.

5. The memory structure as defined in claim 4, wherein the memory device is in a digital film for use in a digital camera.

6. The memory structure as defined in claim 4, wherein the memory device is in a memory card.

7. The memory structure as defined in claim 1, wherein the electrically linear resistive element comprises intrinsic silicon and the voltage breakdown element comprises an antifuse having a dielectric with a thickness not greater than about 200 Angstroms.

8. An apparatus including the memory structure as defined in claim 1, wherein the apparatus is selected from the group consisting of a digital camera, a hand held scanner, a desk top scanner, a fax machine, a copier, a multifunction peripheral (MFP), and a digital network copier.

9. A memory structure comprising a plurality of row conductors intersecting a plurality of column conductors at a plurality of intersections, each said intersection including an electrically linear resistive element in series with a voltage breakdown element, wherein: each of the row and column conductors are patterned; and the electrically linear resistive element is patterned; and
the voltage breakdown element is not patterned.

10. A memory structure comprising a primary plurality of memory elements each including a row conductor connected to a column conductor by an electrically linear resistive element in series with a voltage breakdown element that is not patterned.

11. The memory structure as defined in claim 10, wherein the electrically linear resistive element is selected from the group consisting of lightly doped microcrystalline silicon, lightly doped amorphous silicon, intrinsic silicon, refractory metal silicide nitride, and tungsten silicide nitride.

12. The memory structure as defined in claim 10, wherein the electrically linear resistive element is selected from the group consisting of an electrical device having an electrical characteristic that, for linear changes in voltage, has a linear change in current.

13. The memory structure as defined in claim 10, wherein the voltage breakdown element is an antifuse that includes a dielectric having a thickness not greater than about 200 Angstroms.

14. The memory structure as defined in claim 10, wherein:
   each said electrically linear resistive element is selected from the group consisting of lightly doped microcrystalline silicon, lightly doped amorphous silicon, intrinsic silicon, refractory metal silicide nitride; and
   each said voltage breakdown element comprises an antifuse having a dielectric with a thickness not greater than 200 Angstroms.

15. The memory structure as defined in claim 10, wherein:
   each said row conductor and each said column conductor comprises patterned aluminum or an alloy thereof;
   the electrically linear resistive element comprises patterned intrinsic silicon; and
   the voltage breakdown element comprises unpatterned aluminum oxide having a thickness not greater than about 200 Angstroms.

16. The memory structure as defined in claim 10, further comprising:
   a secondary electrical insulator upon and over the said primary plurality of memory elements;
   a secondary plurality of said memory elements stacked over said primary plurality of memory elements and on the secondary electrical insulator;
   a third electrical insulator upon and under the said primary plurality of memory elements; and
   a third plurality of said memory elements stacked under said primary plurality of memory elements and on the third electrical insulator.

17. The memory structure as defined in claim 10, further comprising:
   a secondary plurality of memory elements each including one said column conductor of said primary plurality of memory element connected to a row conductor by an electrically linear resistive element in series with a voltage breakdown element;
   a third plurality of memory elements each including one said row conductor of said primary plurality of memory element connected to a column conductor by an electrically linear resistive element in series with a voltage breakdown element.

18. The memory structure as defined in claim 17, wherein for each of the second and third plurality of memory elements:
   each said row and column conductor comprises patterned aluminum or an alloy thereof;
   the electrically linear resistive element comprises patterned intrinsic silicon; and
   the voltage breakdown element comprises unpatterned aluminum oxide having a thickness not greater than about 200 Angstroms.

19. An apparatus including the memory structure as defined in claim 10, wherein the apparatus is selected from the group consisting of a computing device, a multifunction peripheral, a cellular telephone, a personal digital assistant, a facsimile machine, a desk top scanner, a high volume copier, a music playing device, a video playing device, and a portable or fixed electronic apparatus utilizing the memory structure for permanent or removable memory media.

20. A memory structure comprising a plurality of adjacent pairs of row conductors each having there between:
   an electrically linear resistive material;
   a voltage breakdown material; and
   a column conductor;
   wherein the voltage breakdown material is a layer of unpatterned material between each said pair of adjacent row conductors.

21. The memory structure as defined in claim 20, wherein each said pair of adjacent row conductors also has an electrical insulator there between.

22. The memory structure as defined in claim 20, wherein:
   the electrically linear resistive material is selected from the group consisting of lightly doped microcrystalline silicon, lightly doped amorphous silicon, intrinsic silicon, refractory metal silicide nitride; and
   the voltage breakdown material comprises an antifuse having a dielectric with a thickness not greater than 200 Angstroms.

23. A memory structure comprising a plurality of adjacent pairs of patterned row conductors each having there between a voltage breakdown element sandwiched between a column conductor and an electrically linear resistive element in series with the voltage breakdown wherein:
   a layer of unpatterned material is between each said pair of adjacent row conductors: and the layer of unpatterned material is the voltage breakdown element.

24. The memory structure as defined in claim 23, wherein each said pair of adjacent row conductors also has an electrical insulator there between.

25. The memory structure as defined in claim 23, wherein:
   the electrically linear resistive element is selected from the group consisting of lightly doped microcrystalline silicon, lightly doped amorphous silicon, intrinsic silicon, refractory metal silicide nitride; and
   the voltage breakdown element comprises an antifuse having a dielectric with a thickness not greater than 200 Angstroms.

26. A memory structure comprising a plurality of means for storing data; wherein:
   each said means for storing data includes a row conductor connected to a column conductor by:
      means for providing electrically linear resistance; and
      means for programming the means for storing data;
      the means for providing electrically linear resistance is in series with the means for programming the means for storing data, wherein the means for programming is not patterned.

27. The memory structure as defined in claim 26, wherein the means for programming the memory element is a voltage breakdown element.

28. The memory structure as defined in claim 27, wherein:
   the voltage breakdown element comprises an antifuse;
   each of the row and column conductors is patterned;
   the electrically linear resistive element is patterned; and
   the voltage breakdown element is not patterned.

29. A memory storage device comprising:
   a substrate; and
   a plurality of memory elements on the substrate, wherein:
   each said memory element is included in a memory apparatus selected from the group consisting of a WORM memory device and a one time programmable memory device and includes:
      a row conductor connected to a column conductor by an electrically linear resistive element in series with a voltage breakdown element that is not patterned.

30. The memory storage device as defined in claim 29, wherein the memory apparatus is in a data storage device selected from the group consisting of a memory card and a digital film for use in a digital camera.

* * * * *